(12) United States Patent
Johnson

(10) Patent No.: US 6,980,015 B2
(45) Date of Patent: Dec. 27, 2005

(54) BACK SIDE PROBING METHOD AND ASSEMBLY

(75) Inventor: Kenneth William Johnson, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/463,081

(22) Filed: Jun. 17, 2003

(65) Prior Publication Data

US 2004/0257096 A1 Dec. 23, 2004

(51) Int. Cl.⁷ .......................... G01R 31/02; G01R 31/26
(52) U.S. Cl. .................... 324/755; 324/754; 324/765
(58) Field of Search .............................. 324/754, 758, 324/158.1; 174/260, 254; 361/749

(56) References Cited

U.S. PATENT DOCUMENTS

| | | | | |
|---|---|---|---|---|
| 4,116,519 A | * | 9/1978 | Grabbe et al. ................ 439/69 |
| 4,897,918 A | * | 2/1990 | Osaka et al. .................. 29/830 |
| 5,012,187 A | * | 4/1991 | Littlebury .................... 324/754 |
| 5,591,941 A | * | 1/1997 | Acocella et al. ............. 174/266 |
| 5,940,278 A | * | 8/1999 | Schumacher ................. 361/769 |
| 5,953,214 A | * | 9/1999 | Dranchak et al. ........... 361/767 |
| 5,982,027 A | * | 11/1999 | Corisis ....................... 257/666 |
| 6,154,040 A | * | 11/2000 | Tsukamoto et al. ......... 324/755 |
| 6,203,637 B1 | * | 3/2001 | Dommann et al. ........ 156/73.1 |
| 6,258,625 B1 | * | 7/2001 | Brofman et al. ............ 438/107 |
| 6,529,027 B1 | * | 3/2003 | Akram et al. ................ 324/758 |
| 6,577,013 B1 | * | 6/2003 | Glenn et al. ................ 257/777 |
| 6,638,080 B2 | * | 10/2003 | Johnson et al. ............... 439/77 |
| 2003/0102156 A1 | * | 6/2003 | Spielberger et al. ........ 174/260 |
| 2004/0099647 A1 | * | 5/2004 | Biunno et al. ......... 219/121.69 |

* cited by examiner

*Primary Examiner*—Paresh Patel

(57) ABSTRACT

An interface board for probing a device under test having a having an array of connection points on a back side of a board to which the device under test is attached. The interface board is constructed upon a stiff layer having a plurality of pass throughs from a first side to a second side in a pattern matching the array of connection points on the board to which the device under test is attached. An array of pads are formed on a first side of the interface board, each pad having a controlled surface associated with one of the pass throughs.

9 Claims, 2 Drawing Sheets

BACK SIDE PROBING METHOD AND ASSEMBLY

BACKGROUND OF THE INVENTION

Manufactures, distributors, and retailers of populated circuit boards are always looking for test and measurement solutions that not only minimize cost, but also are easy to deploy. Complicating these goals is the fact that many devices that such parties desire to test require the use of a high density interconnect. In the case of a logic analysis probe, it is not unusual that an interconnect having a 49×49 array of connections is required to connect the probe to the board under test. Such interconnects have a total of 2,401 connections. Providing dedicated test pads for each of these connections would not only be expensive but would require considerable time to design.

For socketed chips, known solutions include the provision of an adapter between the socket and the chip or an external interface that fits over a chip (such as a QFP) and contacts the pins extending from the chip. Unfortunately, such probe interfaces are not suitable for use with chips using ball grid array (BGA) packaging solder attached to the board.

One of the more popular solutions for surface mount technologies is the so-called "bed of nails" probe. A bed of nails probes provides an array of pins, typically POGO-PINS, which are clamped over a matrix of connections formed on a board under test. Of course, this requires that the board be produced with such a grid. The ever-existing trend toward smaller packaging puts sever limitations on the availability of space on a PCB to accommodate test matrixes. One variation of such interfaces involves matching a bed of nails probe to a grid of conductors typically found on the opposite side of the PC board from the ball grid array. More specifically, BGA devices are typically associated with a matrix of vias, wherein the individual solder balls are attached to pads connected to vias. It is also known to attach the solder balls of the BGA directly to the vias. In any event, a probe is formed with an array of pins that match the pattern of the vias on the opposite side of the board. This is known in the art as back-side probing.

Unfortunately, current methods and apparatus for backside probing have certain drawbacks. Most significantly, there are a number of physical parameters that are not controlled by the entity doing the actual probing, such as the size, placement and condition of the contacts to which the probe is being connected.

FIG. 1 is a conceptual sectional view of single solder ball 10 of a BGA array on a device 12 being probed from the backside of the target board 14. In this example the solder ball 10 is shown as being connected to a pad 16 formed as part of a via 18, however as noted above this need not necessarily be the case. As a result of processes and design constraints from the customer, the exposed section 20, referred to as the pad 20, of the via 18 on the backside of the target board 14 is not conducive to a reliable connection. While the ideal pad would be a smooth, flat, gold plated, dimensionally controlled surface, the pad 20 is simply bare copper left over from the formation of via 18.

Further, the pad 20 is typically surrounded by solder mask 22, a byproduct of the process used to populate the target board 14. It is typical that the solder mask 22 raises 5 to 10 thousandths of an inch above the level of the pad 20 making it quite difficult for probe to reliably contact the copper pads, especially if an elastomeric connector 23, as shown, is used. The elastomeric connector 23, in this example, is used to make contact to pad 20. The elastomeric connector 23 has conductive members running through it, perpendicular to the board. Instead of an elastomeric connector 23, contact could be attempted with pogo pins. In this case there is the possibility of the pogo pins hitting the exact center of via 18, producing minimal or no compression of the pogo-pin, or that the solder mask surrounding the via may interfere with the pogo pin. Either condition will produce an unreliable contact that can significantly deteriorate the signal.

Accordingly, the present inventors have recognized a need for new apparatus and methods to assist with back side probing that facilitate obtaining reliable connections between the probe and the pads on the device under test.

BRIEF DESCRIPTION OF THE DRAWINGS

An understanding of the present invention can be gained from the following detailed description of the invention, taken in conjunction with the accompanying drawings of which.

DETAILED DESCRIPTION

Figure 1:
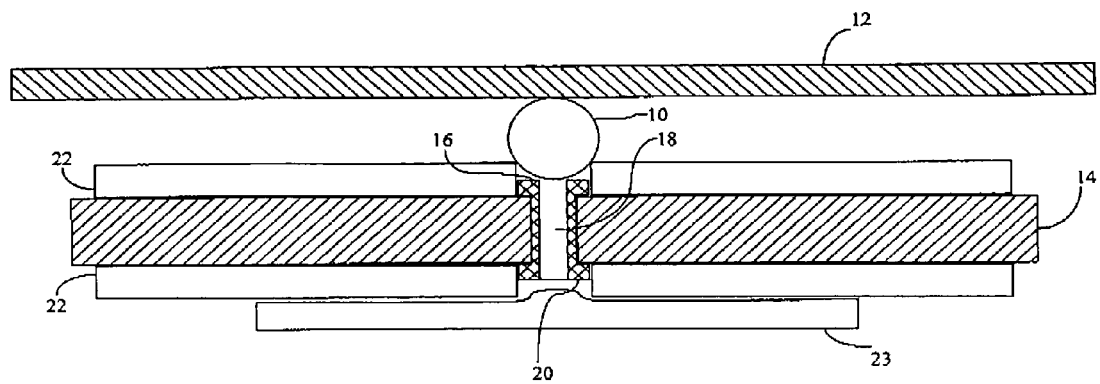
FIG. 1 is a conceptual sectional view illustrating known apparatus and method for backside probing.

Reference will now be made in detail to the present invention, examples of which are illustrated in the accompanying drawings, wherein like reference numerals refer to like elements throughout.

Figure 2:
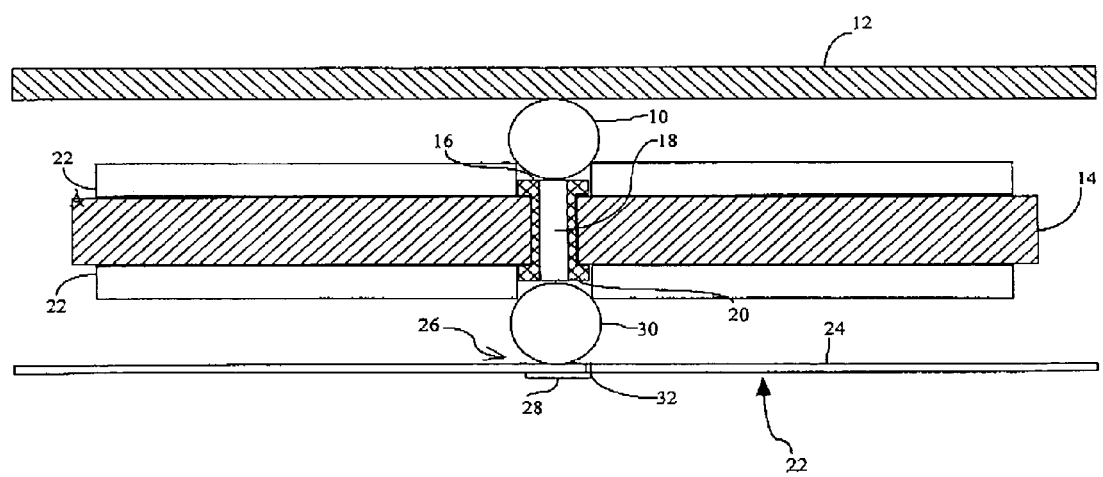
FIG. 2 is a conceptual sectional view illustrating apparatus and method for backside probing in accordance with a preferred embodiment of the present invention.

FIG. 2 is a conceptual sectional view of single solder ball 10 of a BGA array on a device 12 being probed from the backside of the target board 14. The configuration shown in FIG. 2 would be repeated for each desired connection on the target board 14. As in the previous example of known backside probing apparatus and methods, the solder ball 10 is shown as being connected to a pad 16 formed as part of a via 18, however as noted above this need not necessarily be the case. An interface board 22 is connected, using BGA technology to the backside of the target board 14. The interface board generally comprises a support layer 24, preferably either a flexible circuit board or a thin printed circuit board. As such the support layer 24 is referred to hereinafter as the circuit board 24. Any suitable material, such as CAPTON or FR-4, capable of forming a circuit board having a Thickness of about one hundredth of an inch may be used. Through circuits are formed on the circuit board 24, Preferably, each through circuit comprises a pad 26, on the side of the circuit board 24 to be connected to the target board, and an interface pad 25 on the side of the interface board 22 to be probed. The pad 26 and the interface pad 28 (sometimes referred to simply as "pad 28") are connected using a pass through circuit. The interface pad 28 is preferably a smooth, flat, gold (solid or plated), dimensionally controlled surface, if necessary, the interface pad 25 can be lapped, along with all of the interface pads on the interface board 22 to ensure flatness and co-planarity.

Each pass through circuit connecting a pair of pads (26 and 28) is preferably formed using a via. The pad 26 can be any structure that facilitates the formation of the BGA and need not be machined as thoroughly as the pad 28. In perhaps the preferred configuration, as shown in FIG. 2, the pass through circuit is formed using a "micro" via 32 offset to the side of the controlled pad 28. This configuration produces figure 8 patterns with one of the circles being very small. As known to those of ordinary skill in the art, there is an aspect ratio that should be held when making vias (diameter-to-length). Because the circuit board 24 is very thin, the vias 32 can be quite small. Another configuration that may be employed is to fill a larger via in the center of the pad with conductive epoxy. The surface is then lapped to produce a flat controlled surface. The resulting surface can be gold plated to optimize conductivity.

Preferably, the total thickness of the interface board 22 is 1 mm or less. This is sufficient to permit the use of interface pads having a sufficient quality while minimizing stub lengths. Limiting the stub length to 1 mm minimizes any capacitance and inductance introduced by the interface assembly.

The interface board 22 is preferably attached to the target board 14 using BGA technology wherein a solder ball 30 connects each pad 26 to a corresponding pad 20. Using BGA technology allows the interface board 22 to be attached to select target boards using standard in-house re-work processes. Alternatively, depending on the economics of the target board, an interface board 22 could be added to each target board during population.

Figure 3:
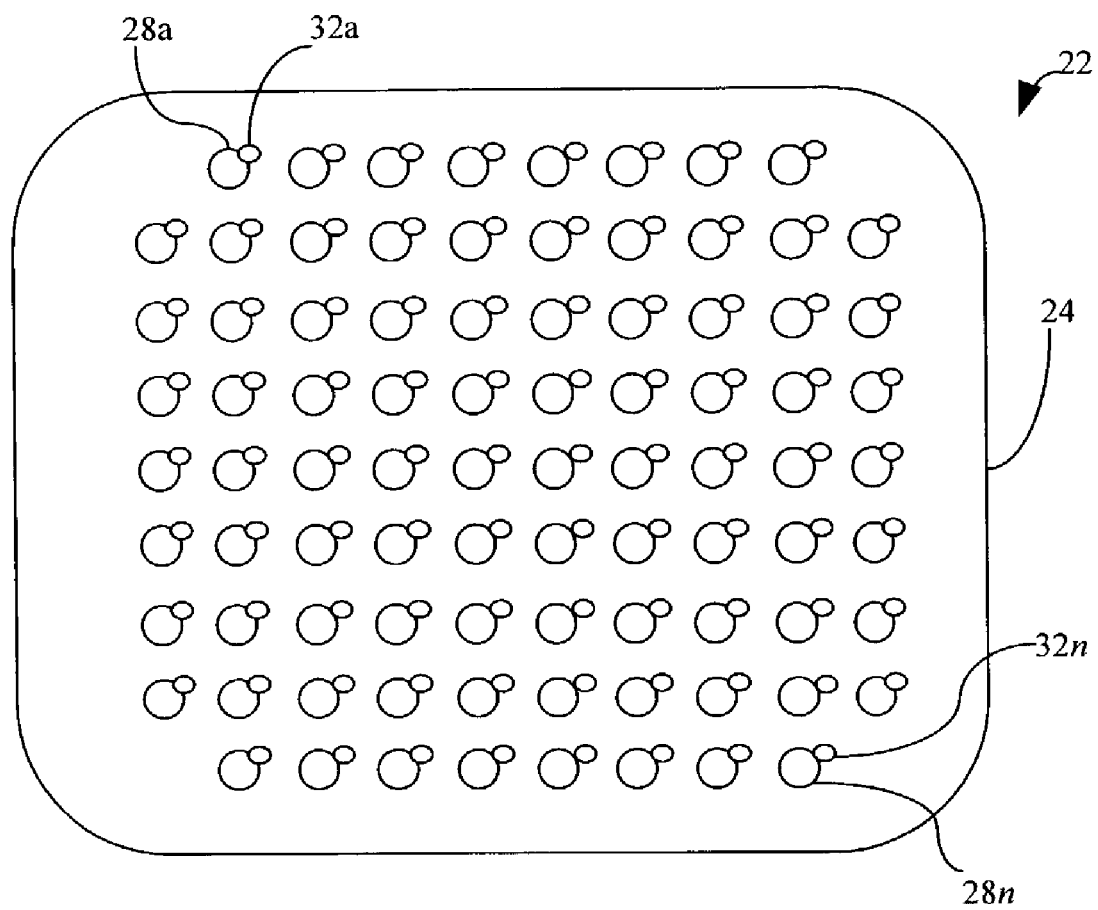
FIG. 3 is a plan view of an interface board in accordance with the preferred embodiment of the present invention.

FIG. 3 is a plan view of an interface board 22 in accordance with the preferred embodiment of the present invention. In this case the interface board 22 has been fabricated to match an 86 pin PBGA produced by Motorola (896A-01) with 86 pads 28a–28n placed in a pattern to match the pins on the PBGA (not shown). FIG. 3 portrays the configuration in which vias 32a–32n are placed to the side of the interface pads 28n.

Although an embodiment of the present invention has been shown and described, it will be appreciated by those skilled in the art that changes may be made in these embodiments without departing from the principles and spirit of the invention, the scope of which is defined in the claims and their equivalents.

What is claimed is:

1. A probe system comprising:
   a printed circuit board;
   a device under test attached to the printed circuit board on a first side of the printed circuit board such that the printed circuit board has an array of connection points on a second side opposite of which the device under test is attached, the array of connection points electrically connected to connectors on the device under test;
   an interface board having:
      a support layer;
      an array of pads on a first side of the support layer, each pad having a controlled surface, the array of pads matching the array of connection points on the printed circuit board;
      a plurality of pass throughs extending from the array of pads on the first side to a second side of the interface board, the second side of the interface board being connected to the connection points on second side of the printed circuit board using a ball grid array, the pass throughs connecting the connection points on the second side of the printed circuit board to the array of pads on a first side; and
   a probe having an array that interfaces with the array of pads.

2. The probe system, as set forth in claim 1, wherein the support layer comprises a circuit board about $1/100$" thick.

3. The probe system, as set forth in claim 2, wherein the pass throughs comprise a pattern of vias matching the array of connection point on the board to which the device under test is attached.

4. The probe system, as set forth in claim 2, wherein the circuit board comprises a flex-circuit board.

5. The probe system, as set forth in claim 4, wherein the circuit board is formed of CAPTON or FR-4.

6. The probe system, as set forth in claim 3, wherein the array of pads comprises gold pads.

7. The probe system, as set forth in claim 6, wherein the gold pads are lapped to ensure a flat surface.

8. The probe system, as set forth in claim 3, wherein the gold pads are attached to each of the vias using a ball grid array.

9. The probe system, as set forth in claim 3, wherein the pads are formed by filling each of the vias with a conductive material and lapping the interface board to produce a uniform surface.

* * * * *